(12) United States Patent
Kim et al.

(10) Patent No.: US 9,316,923 B2
(45) Date of Patent: Apr. 19, 2016

(54) EXPOSURE APPARATUS AND EXPOSURE METHOD USING THE SAME

(75) Inventors: Chang-Hoon Kim, Asan-si (KR); Gug-Rae Jo, Asan-si (KR); Hong-Suk Yoo, Anysang-si (KR); Bo-Kyoung Ahn, Cheonan-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 1146 days.

(21) Appl. No.: 13/082,081

(22) Filed: Apr. 7, 2011

(65) Prior Publication Data

US 2012/0013876 A1   Jan. 19, 2012

(30) Foreign Application Priority Data

Jul. 19, 2010   (KR) .................. 10-2010-0069567

(51) Int. Cl.
*G03B 27/42* (2006.01)
*G03F 7/20* (2006.01)

(52) U.S. Cl.
CPC ............ *G03F 7/7035* (2013.01); *G03F 7/7015* (2013.01); *G03F 7/70058* (2013.01)

(58) Field of Classification Search
CPC .... G03B 21/28; G03B 21/2066; G03B 21/00; G03B 21/142; G03B 21/2053; G03B 21/208; G03B 21/60; G03B 27/72; G03B 33/08; G03B 33/12
USPC .................. 355/53, 67, 69, 71, 77
See application file for complete search history.

(56) References Cited

U.S. PATENT DOCUMENTS

| | | | |
|---|---|---|---|
| 2003/0007137 A1* | 1/2003 | Iwanaga .................... | 355/51 |
| 2005/0122601 A1* | 6/2005 | Takeuchi et al. ............. | 359/831 |
| 2009/0168028 A1* | 7/2009 | Magarill ................... | 353/81 |
| 2009/0190101 A1* | 7/2009 | Alasaarela et al. ............ | 353/81 |
| 2009/0219500 A1* | 9/2009 | Tel et al. .................... | 355/67 |

FOREIGN PATENT DOCUMENTS

| | | |
|---|---|---|
| JP | 2007-193154 A | 8/2007 |
| JP | 2007-310007 A | 11/2007 |
| JP | 2008-040066 A | 2/2008 |
| KR | 1020080059546 A | 6/2008 |
| KR | 10-2008-0113394 A | 12/2008 |
| WO | 2007/132610 A1 | 11/2007 |

* cited by examiner

*Primary Examiner* — Mesfin T Asfaw
(74) *Attorney, Agent, or Firm* — Innovation Counsel LLP

(57) ABSTRACT

Provided are an exposure apparatus and an exposure method using the same. The exposure apparatus includes: a light source unit configured to emit light; a substrate stage supporting a substrate, the substrate comprising an exposure area and a non-exposure area; and a prism unit disposed between the light source unit and the substrate stage, the prism unit movable so as to transmit the light to the exposure area and to block the light from the non-exposure area.

16 Claims, 15 Drawing Sheets

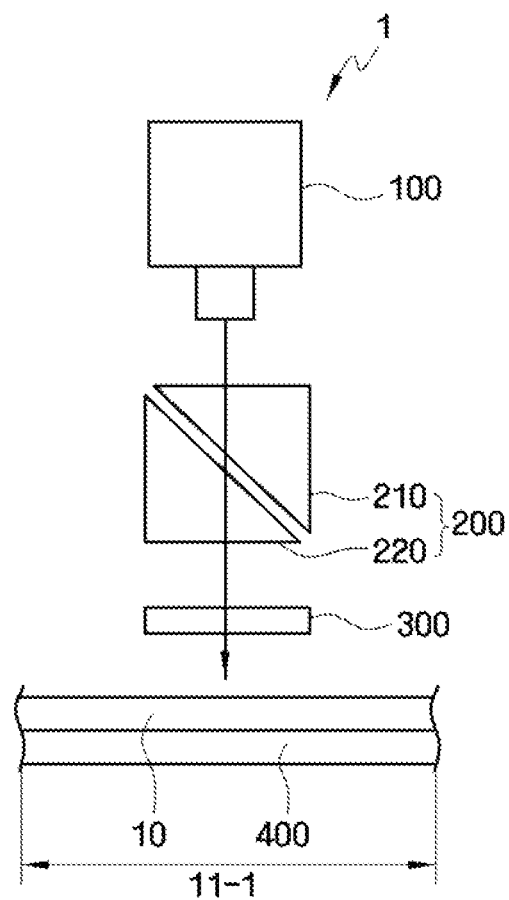

EXPOSURE APPARATUS AND EXPOSURE METHOD USING THE SAME

This application claims priority from Korean Patent Application No. 10-2010-0069567 filed on Jul. 19, 2010 in the Korean Intellectual Property Office, the disclosure of which is incorporated herein by reference in its entirety.

BACKGROUND OF THE INVENTION

1. Field of the Invention

The present invention relates generally to flat panel displays. More specifically, the present invention relates to an exposure apparatus and an exposure method for fabricating flat panel displays.

2. Description of the Related Art

Large flat panel displays (FPDs), such as liquid crystal displays (LCDs) and plasma displays, are currently desirable due to the fact that they can support large screen sizes while remaining thin and relatively low-weight. The fabrication of an FPD panel often involves transferring mask patterns onto a substrate through a proximity exposure process. An exposure apparatus used in this exposure process may include a plurality of masks, each having a smaller size than that of the substrate that is to be exposed to light. In addition, the exposure apparatus may include a blocking unit which blocks light from reaching areas of the substrate that are not to be exposed to light.

When this exposure apparatus is used in an exposure process, the amount of light irradiated onto the substrate is often not constant due to the blocking unit. That is, different areas of the substrate receive differing amounts of light during an exposure process. Accordingly, stain defects can be generated in an exposure area of the substrate, resulting in a reduction in the quality of display panels manufactured using this exposure apparatus.

SUMMARY OF THE INVENTION

Aspects of the present invention provide an exposure apparatus generating fewer stain defects in an exposure area during an exposure process.

Aspects of the present invention also provide an exposure method which generates fewer stain defects in an exposure area during an exposure process.

However, the various aspects of the present invention are not restricted to the one set forth herein. The above and other aspects of the present invention will become more apparent to one of ordinary skill in the art to which the present invention pertains by referencing the detailed description of the present invention given below.

According to an aspect of the present invention, there is provided an exposure apparatus including: a light source unit configured to emit light; a substrate stage supporting a substrate, the substrate comprising an exposure area and a non-exposure area; and a prism unit disposed between the light source unit and the substrate stage, the prism unit movable so as to transmit the light to the exposure area and to block the light from the non-exposure area.

According to another aspect of the present invention, there is provided an exposure method including: providing a substrate comprising an exposure area and a non-exposure area; irradiating light onto the substrate; inputting the light to a prism unit; while overlapping the prism unit and the exposure area, moving the prism unit so as to transmit the light through the prism unit; and while overlapping the prism unit and the exposure area, moving the prism unit so as to block the light from the non-exposure area by substantially reflecting the light.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION OF THE INVENTION

Figure 1:
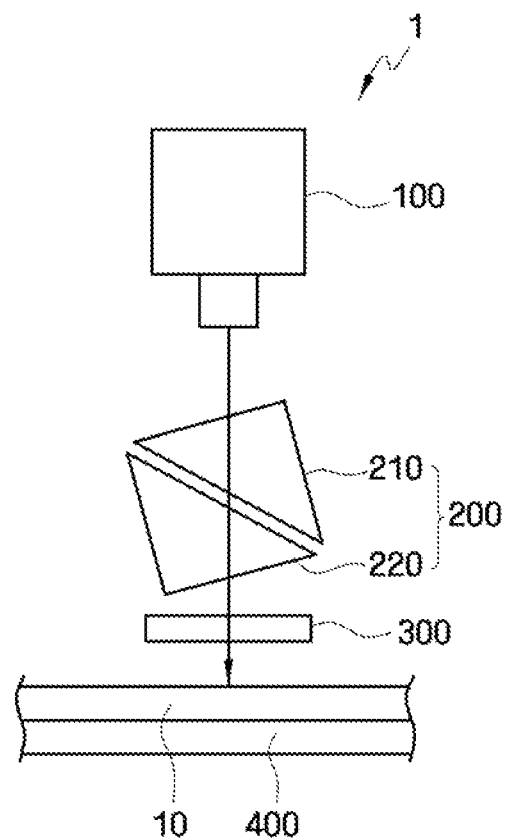
FIG. 1 is a side view of an exposure apparatus according to an exemplary embodiment of the present invention.

Advantages and features of the present invention and methods of accomplishing the same may be understood more readily by reference to the following detailed description of exemplary embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

It will be understood that when an element or layer is referred to as being "on" another element or layer, the element or layer can be directly on another element or layer or intervening elements or layers may also be present. In contrast, when an element is referred to as being "directly on" another element or layer, there are no intervening elements or layers present. As used herein, the term "and/or" includes any and all combinations of one or more of the associated listed items.

Spatially relative terms, such as "below", "beneath", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation, in addition to the orientation depicted in the figures. Throughout the specification, like reference numerals in the drawings denote like elements.

Embodiments of the invention are described herein with reference to plan and cross-section illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein Hereinafter, an exposure apparatus and an exposure method using the same according to exemplary embodiments of the present invention will be described with reference to the attaching drawings.

Figure 2:
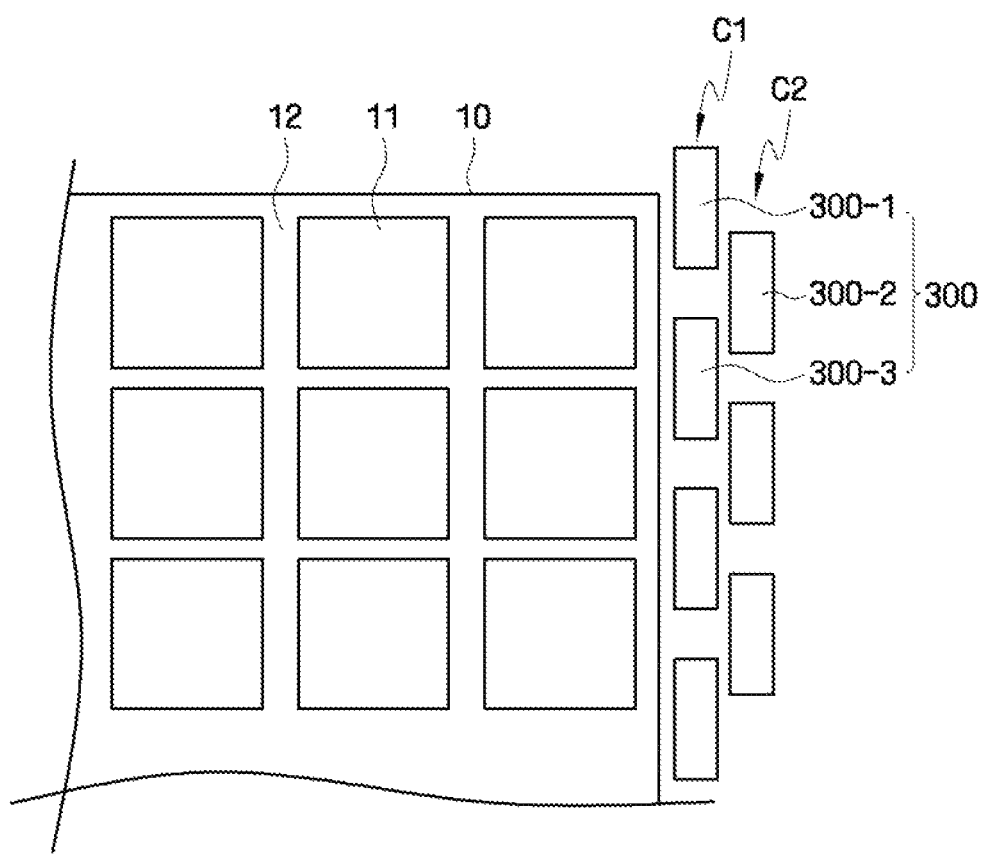
FIG. 2 is a top view of the exposure apparatus shown in FIG. 1.

First, an exposure apparatus according to an exemplary embodiment of the present invention will be described with reference to FIGS. 1 and 2. FIG. 1 is a side view of an exposure apparatus 1 according to an exemplary embodiment of the present invention. FIG. 2 is a top view of the exposure apparatus 1 shown in FIG. 1.

Referring to FIGS. 1 and 2, the exposure apparatus 1 according to the current exemplary embodiment may include a light source unit 100, a prism unit 200, a mask unit 300, and a substrate stage 400. A substrate 10, which is to be exposed to light, is placed on the substrate stage 400. Here, the substrate 10 may include an exposure area 11, which is to be exposed to light, and a non-exposure area 12 which is not to be exposed to light.

The light source unit 100 irradiates light onto the substrate 10. To this end, the light source unit 100 may include a light source (not shown) which emits light, and an optical system which includes an exposure lens (not shown). The light source may be, but is not limited to, an Hg lamp (365 nm) or an Nd-YAG laser (355 nm).

The prism unit 200 is placed between the light source unit 100 and the substrate stage 400. The prism unit 200 allows light emitted from the light source unit 100 to pass therethrough and reach the exposure area 11 of the substrate 10, or blocks the light so as to prevent the light from reaching the non-exposure area 12. This will be described in more detail below.

The mask unit 300 contains a predetermined pattern which is to be transferred onto the exposure area 11 of the substrate 10. To this end, the mask unit 300 may include a light-blocking portion (not shown) which blocks irradiated light, and a pattern portion 310 (see FIG. 4) which includes a light-passing portion that passes the irradiated light. That is, the pattern portion 310 of the mask unit 300 is shaped so that some parts allow light to pass through, and other parts block light, thus forming the predetermined pattern. Accordingly, the predetermined pattern contained in the pattern portion 310 of the mask unit 300 can be transferred onto the exposure area 11 of the substrate 10.

The exposure apparatus 1 according to the current exemplary embodiment may include a plurality of masks 300-1 through 300-3, each having a smaller size than that of the entire substrate 10. The masks 300-1 through 300-3 may be arranged in two columns c1 and c2 in a zigzag fashion, that is, they may be arranged in an alternating manner. For example, the exposure apparatus 1 according to the current exemplary embodiment may divide one exposure area 11 into, e.g., three sections, and irradiate light to the three sections by using the masks 300-1 through 300-3.

More specifically, when the exposure area 11 is divided into upper, middle, and lower sections, the upper section of the exposure area 11 may be exposed by the mask 300-1 in the first column c1, the middle section of the exposure area 11 may be exposed by the mask 300-2 in the second column c2, and the lower section of the exposure area 11 may be exposed by the mask 300-3 in the first column c1. Accordingly, even when the size of the substrate 10 increases, the exposure of the substrate 10 can be performed without increasing the overall size of the mask unit 300. That is, even when the size of the substrate 10 increases, the substrate 10 can be exposed to light by simply increasing the number of relatively small masks 300-1 through 300-3 that are used. Therefore, there is no need to increase the overall size of the mask unit 300. This helps reduce mask costs, which, in turn, reduces the overall manufacturing costs.

The substrate 10, which is to be exposed to light by the exposure apparatus 1, is placed on the substrate stage 400. The substrate stage 400 may include a holding unit (not shown) to prevent movement of the substrate 10 during the exposure process, so that the substrate 10 can be exposed to light in a more stable manner.

Figure 4:
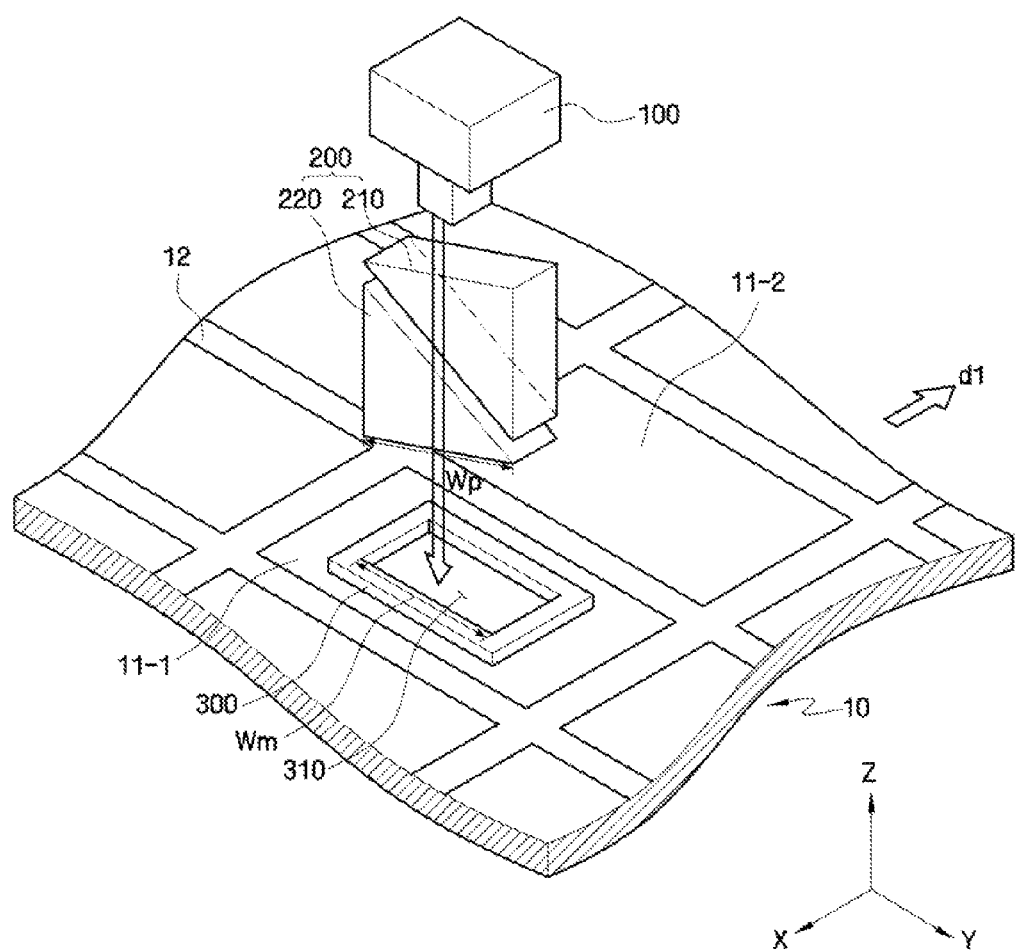
FIGS. 4 and 5 are diagrams for explaining an exposure method that uses the exposure apparatus of FIG. 1.

During the exposure process, the substrate stage 400 moves the substrate 10 in, for example, a first direction d1 (see FIG. 4). Thus, even if the light source unit 100 and the mask unit 300 are fixed in place, the entire surface of the substrate 10 can be exposed to light. To this end, the substrate stage 400 may include a substrate-transferring unit (not shown). In addition, the exposure apparatus 1 according to the current exemplary embodiment may include a substrate transferring unit driver (not shown) which drives the substrate-transferring unit.

Figure 3:
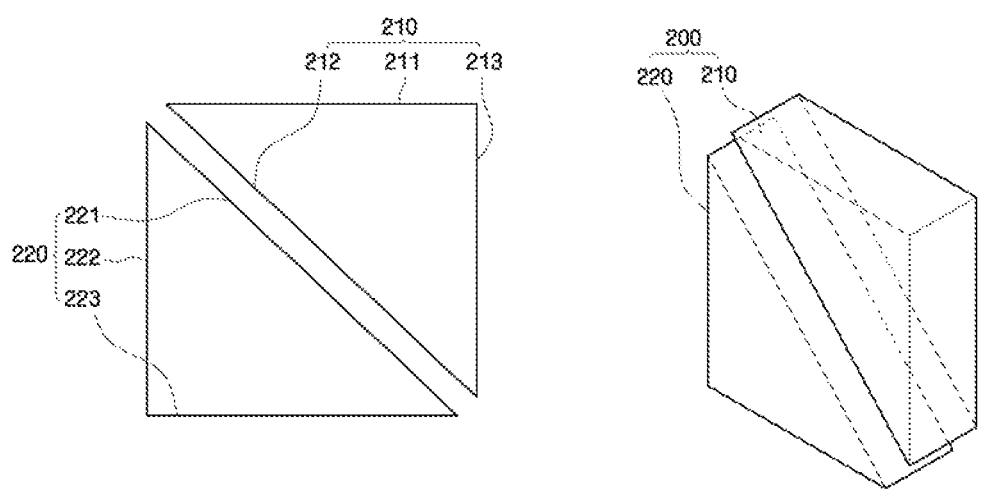
FIG. 3 is a diagram illustrating a prism unit included in the exposure apparatus of FIG. 1.

The prism unit 200 included in the exposure apparatus 1 according to the current exemplary embodiment of the present invention will now be described with reference to FIG. 3. FIG. 3 is a diagram illustrating the prism unit 200 included in the exposure apparatus 1 of FIG. 1.

Referring to FIG. 3, the prism unit 200 of the exposure apparatus 1 of FIG. 1 may include a first prism 210 and a second prism 220. The first prism 210 includes a first surface 211 upon which light emitted from the light source unit 100 is incident, and a second surface 212 which transmits or reflects the incident light. In this embodiment, the first surface 211 and the second surface 212 form a predetermined angle with respect to each other, and are not parallel.

The prism unit 200 may further include the second prism 220, upon which light that passes through the first prism 210 is incident. Only that light which passes through the first prism 210 can pass through to the second prism 220. The second prism 220 may be used to increase the "straightness" of light that passes through the first prism 210. That is, the path of that light which passes through the first prism 210 may not be perpendicular to the substrate 10, due to the difference between the refractive index of the first prism 210 and that of the space outside the first prism 210. However, if the light which passes through the first prism 210 is then transmitted through the second prism 220, the path of the light can be corrected to be perpendicular to the substrate 10.

To this end, the second prism 220 may include a third surface 221 upon which light that passes through the first prism 210 is incident, and a fourth surface 223 from which the light exits. In this embodiment, the third surface 221 and the fourth surface 223 form a predetermined angle with respect to each other and are not parallel. The first prism 210 and the second prism 220 are separated by a predetermined distance, such that the third surface 221 of the second prism 220 is substantially parallel to the second surface 212 of the first prism 210. The first prism 210 and the second prism 220 may have substantially the same refractive index, perhaps by being made of the same material. For example, when the first prism 210 is made of quartz, the second prism 220 may also be made of quartz. In this case, both of the first and second prisms 210 and 220 may have the refractive index of quartz, i.e., a refractive index of 1.533.

When the prism unit 200 overlaps the exposure area 11 of the substrate 10, light emitted from the light source unit 100 is allowed to pass therethrough, and onto the substrate 10. On the other hand, when the prism unit 200 overlaps the non-exposure area 12 of the substrate 10, light emitted from the light source unit 100 is blocked, and does not irradiate the substrate 10. To this end, the first and second prisms 210 and 220 of the prism unit 200 may be rotated at predetermined angles. That is, the prism unit 200 may be oriented at different angles when it overlaps the exposure area 11 of the substrate 10, as compared to when it overlaps the non-exposure area 12 of the substrate 10. This will be described in more detail later.

Figure 5:
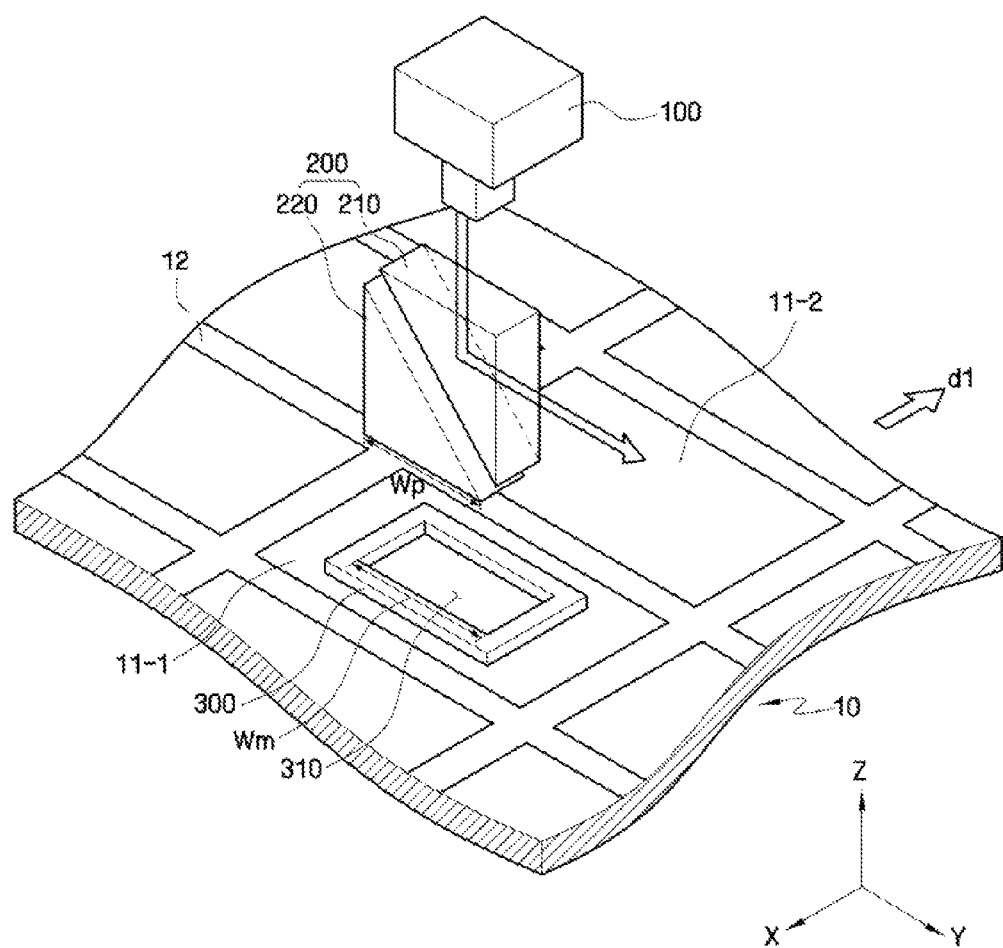
Figure 6:
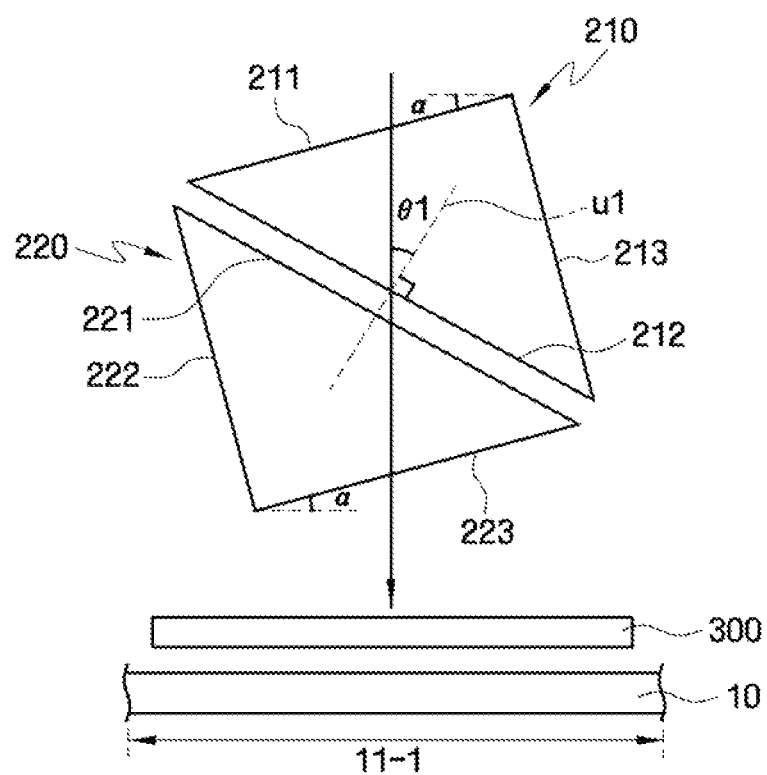
FIG. 6 is a diagram illustrating a case where the prism unit of the exposure apparatus of FIG. 1 overlaps an exposure area of a substrate.
Figure 7:
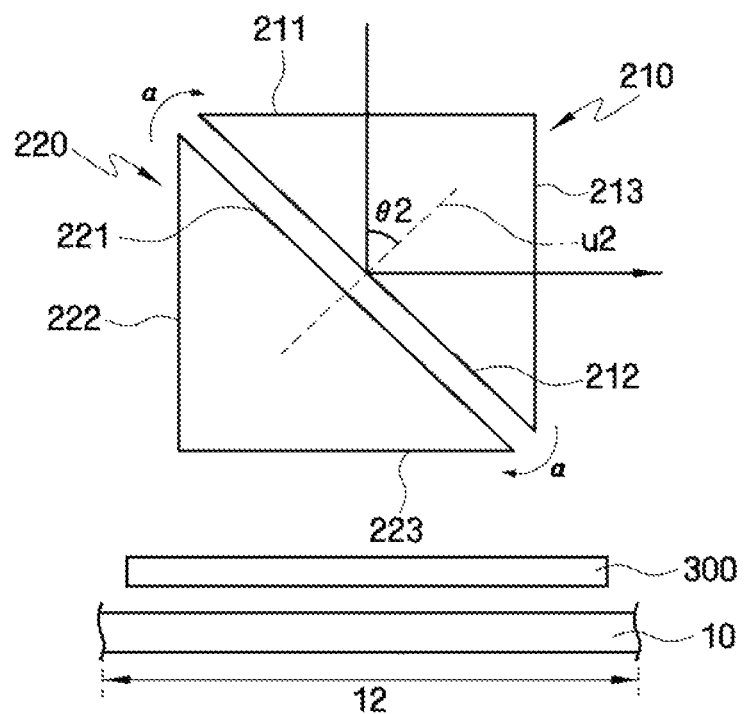
FIG. 7 is a diagram illustrating a case where the prism unit of the exposure apparatus of FIG. 1 overlaps a non-exposure area of the substrate.

An exposure method using the exposure apparatus 1 of FIG. 1 will now be described with reference to FIGS. 4 through 7. FIGS. 4 and 5 are diagrams for explaining an exposure method that uses the exposure apparatus 1 of FIG. 1. FIG. 6 is a diagram illustrating a case where the prism unit 200 of the exposure apparatus 1 of FIG. 1 overlaps the exposure area 11 of the substrate 10. FIG. 7 is a diagram illustrating a case where the prism unit 200 of the exposure apparatus 1 of FIG. 1 overlaps the non-exposure area 12 of the substrate 10.

Referring to FIGS. 4 and 6, when the exposure apparatus 1 of FIG. 1 overlaps the exposure area 11 of the substrate 10, light is transmitted from the light source unit 100 to the mask unit 300.

Specifically, it is assumed that a first exposure area 11-1 and a second exposure area 11-2 of the substrate 10 are arranged with the non-exposure area 12 interposed therebetween. When the prism unit 200 of the exposure apparatus 1 overlaps the first exposure area 11-1, the first prism 210 of the prism unit 200 transmits light emitted from the light source unit 100 therethrough, and the transmitted light is incident on the second prism 220 such that its path can be corrected. When the light incident on the second prism 220 passes through the second prism 220, its path is made generally perpendicular to the substrate 10. The light that transmits through the second prism 220 passes through the pattern portion 310 of the mask unit 300, to reach the first exposure area 11-1 of the substrate 10. Here, a width Wm of the pattern portion 310 may be substantially equal to a width Wp of the second prism 220. Alternatively, the width Wm of the pattern portion 310 may be smaller than the width Wp of the second prism 220. Accordingly, the light can be prevented from reaching portions of the first exposure area 11-1 other than those corresponding to the pattern portion 310. Therefore, a situation where a pattern different from a pattern formed on the pattern portion 310 is transferred to the first exposure area 11-1 (i.e. unwanted light is irradiated upon a portion of area 11-1 outside of pattern portion 310) can be prevented.

For the first prism 210 to transmit light, light incident upon the first prism 210 and the second surface 212 of the first prism 210 must satisfy a predetermined condition.

Referring to FIG. 6, for the prism unit 200 to transmit light emitted from the light source unit 100, a first angle θ1 formed by the second surface 212 of the first prism 210 and the light incident upon the first prism 210 must be smaller than a predetermined value, in order to prevent light emitted by the light source unit 100 from reflecting off one of the surfaces of the prisms 210, 220 and away from the mask unit 300. More specifically, the first angle θ1 may be defined as an angle between the light incident upon the first prism 210 and a first normal u1 of the second surface 212 of the first prism 210.

The size of the first angle θ1 may be determined according to $\sin^{-1}(n_o/n_1)$, where $n_1$ indicates the refractive index of the first prism 210, and $n_0$ indicates the refractive index of the space outside the first prism 210. For example, when the first prism 210 is made of quartz and when the refractive index $n_0$ of the space outside the first prism 210 is one (1.0), the first angle θ1 may be determined by the above equation. That is, since the refractive index of quartz is 1.533, the refractive index $n_1$ of the first prism 210 may be determined to be 1.533. Accordingly, the size of $\sin^{-1}(n_o/n_1)$ may be determined to be $\sin^{-1}(1/1.533)$, which equals 40.716°. Therefore, for the prism unit 200 to transmit light emitted from the light source unit 100, the first angle θ1 formed by the light incident upon the first prism 210 and the first normal u1 of the second surface 212 of the first prism 210 must be smaller than 40.716°. Accordingly, the prism unit 200 may be rotated such that the first angle θ1 of the first prism 210 becomes smaller than 40.716°.

As described above, the size of the first angle θ1 is determined by the refractive index $n_1$ of the first prism 210 and the refractive index $n_0$ of the space outside the first prism 210. Therefore, the first angle θ1 should be smaller than 40.716° only when the first prism 210 is made of quartz and the refractive index $n_0$ of the space outside the first prism 210 is one. Thus, the magnitude of the first angle θ1 is not limited to the above example, and may vary according to the refractive index $n_1$ of the first prism 210 and the refractive index $n_0$ of the space outside the first prism 210.

Referring to FIGS. 5 and 7, when the exposure apparatus 1 of FIG. 1 overlaps the non-exposure area 12 of the substrate 10, it blocks light emitted from the light source unit 100 such that the light cannot proceed toward the mask unit 300. Consequently, the exposure apparatus 1 prevents the light from reaching the non-exposure area 12 of the substrate 10.

Specifically, it is assumed that the non-exposure area 12 is located between the first exposure area 11-1 and the second exposure area 11-2 of the substrate 10. When the prism unit 200 of the exposure apparatus 1 overlaps the non-exposure area 12, the first prism 210 of the prism unit 200 is oriented so as to substantially reflect all light emitted from the light source unit 100, thereby preventing the light from reaching the non-exposure area 12. That is, when the prism unit 200 overlaps the non-exposure area 12, it is rotated so as to block light from the light source 100, preventing it from propagating toward the substrate 10. Thus, the light is unable to enter the second prism 220.

For the first prism 210 to reflect substantially all light from the light source 100, the light incident upon the first prism 210 and the second surface 212 of the first prism 210 must satisfy a predetermined condition.

Referring to FIG. 7, for the prism unit 200 to reflect substantially all light emitted from the light source unit 100, a second angle θ2 formed by the second surface 212 of the first prism 210 and the light incident upon the first prism 210 must be greater than or equal to a predetermined value. Here, the second angle θ2 may be defined as an angle between the light incident upon the first prism 210 and a second normal u2 of the second surface 212 of the first prism 210.

The size of the second angle θ2 may be determined according to $\sin^{-1}(n_o/n_1)$, where $n_1$ indicates the refractive index of the first prism 210, and $n_0$ indicates the refractive index of the space outside the first prism 210. For example, when the first prism 210 is made of quartz and when the refractive index $n_0$ of the space outside the first prism 210 is one (1.0), the second angle θ2 may be determined to be to be $\sin^{-1}(1/1.533)$, which equals 40.716°. Therefore, for the prism unit 200 to substantially reflect all light emitted from the light source unit 100, the second angle θ2 must be greater than or equal to 40.716°. Accordingly, the prism unit 200 may be rotated such that the second angle θ2 of the first prism 210 becomes greater than or equal to 40.716°.

Referring to FIGS. 6 and 7, to transmit light, the prism unit 200 may be positioned at a predetermined angle α with respect to the substrate 10. As above, to reflect light, the prism unit 200 may be rotated to an angle greater than θ2=40.716°. For example, the prism unit 200 may be rotated so that fourth surface 223 is parallel to the substrate 10. This can also be stated as a rotation of the prism unit 200 by the predetermined angle α. Since the second surface 212 of the first prism 210 is maintained parallel to the third surface 221 of the second prism 220, the first prism 210 and the second prism 220 may both be simultaneously rotated by the predetermined angle α. The exposure apparatus 1 of FIG. 1 may further include a prism rotator (not shown) to rotate the prism unit 200.

As described above, the size of the second angle θ2 is determined by the refractive index $n_1$ of the first prism 210 and the refractive index $n_0$ of the space outside the first prism 210. Therefore, the second angle θ2 is greater than or equal to 40.716° only when the first prism 210 is made of quartz and the refractive index $n_0$ of the space outside the first prism 210 is one. Thus, the size of the second angle θ2 is not limited to the above example, and may vary according to the refractive index $n_1$ of the first prism 210 and the refractive index $n_0$ of the space outside the first prism 210.

As described above, the prism unit 200 that overlapped the first exposure area 11-1 can also overlap the non-exposure area 12. To this end, the substrate 10 may be moved in the first direction d1 by, for example, the substrate stage 400. Accordingly, the prism unit 200 may successively overlap the first exposure area 11-1 and the non-exposure area 12. If the substrate 10 is moved even further along the first direction d1, the prism unit 200 may then overlap the second exposure area 11-2.

That is, as the substrate 10 moves in the first direction d1, the prism unit 200 sequentially overlaps the first exposure area 11-1, the non-exposure area 12, and the second exposure area 11-2. Accordingly, the prism unit 200 is rotated so as to, in order, transmit, substantially reflect, and then transmit light emitted from the light source unit 100. In further detail, when the prism unit 200 overlaps the first exposure area 11-1, it is rotated so as to transmit light from the light source unit 100 to the first exposure area 11-1. When the prism unit 200 overlaps the non-exposure area 12, it is rotated so as to substantially reflect light from the light source unit 100, and thus prevent the light from reaching the non-exposure area 12. When the prism unit 200 overlaps the second exposure area 11-2, it is again rotated so as to transmit light from the light source unit 100 to the second exposure area 11-2.

In summary, the exposure apparatus 1 of FIG. 1 performs the exposure process on the whole surface of the substrate 10, as the prism unit 200 repeats the operation of repeatedly transmitting and reflecting light emitted from the light source unit 100. Here, the light source unit 100, the prism unit 200, and the mask unit 300 may remain stationary. In this case, the prism unit 200 may be rotated according to whether it overlaps the exposure area 11 or the non-exposure area 12 of the substrate 10 so as to transmit or totally reflect light emitted from the light source unit 100.

As described above, since the prism unit 200 transmits or reflects light during the exposure process as desired, light can be prevented from irradiating some areas of the substrate 10, thus reducing or preventing stain defects resulting from differences in exposure.

Further, the exposure apparatus 1 of FIG. 1 and the exposure method using the same are employed to perform the exposure process on the substrate 10 by simply rotating the prism unit 200, without moving the prism unit 200 in the first direction d1 and without a loss in the amount of light that is allowed to enter the exposure area 11.

Another exposure method using the exposure apparatus 1 of FIG. 1 will now be described with reference to FIGS. 8A through 11B. FIGS. 8A through 11B are diagrams for explaining another exposure method that uses the exposure apparatus 1 of FIG. 1. Here, FIGS. 8A, 9A, 10A and 11A are front views of the exposure apparatus 1 performing an exposure process. FIGS. 8B, 9B, 10B, and 11B are side views of the exposure apparatus 1 performing the exposure process.

Figure 8B:
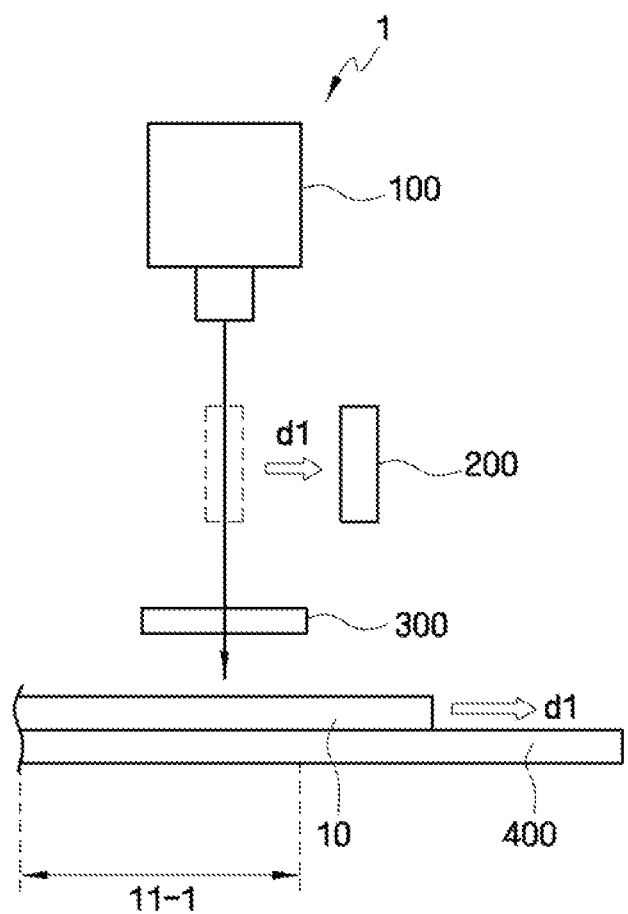
FIGS. 8A through 11B are diagrams for explaining another exposure method that uses the exposure apparatus of FIG. 1.

Referring to FIGS. 8A and 8B, light emitted from the light source unit 100 travels directly to the first exposure area 11-1 of the substrate 10 without passing through the prism unit 200. Here, the prism unit 200 is moved to a position that does not overlap the first exposure area 11-1. To this end, the prism unit 200 may be moved parallel to the substrate 10 in the first direction d1.

Figure 9A:
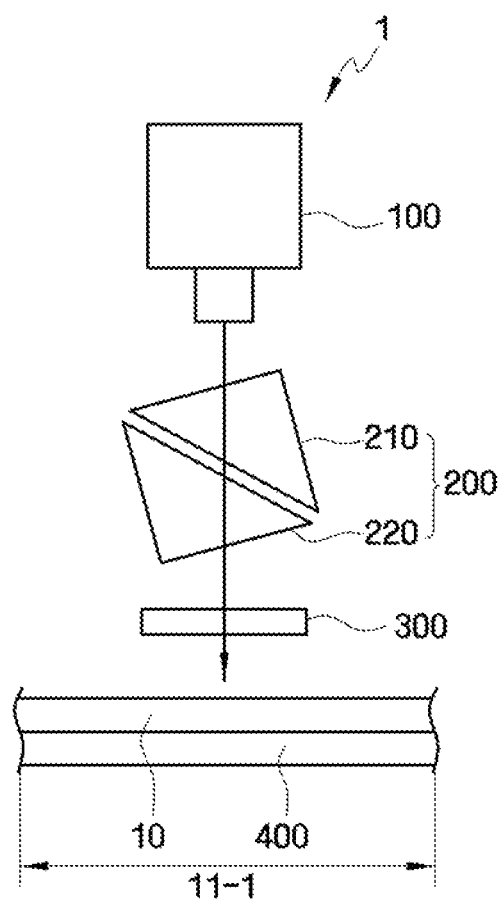
Figure 9B:
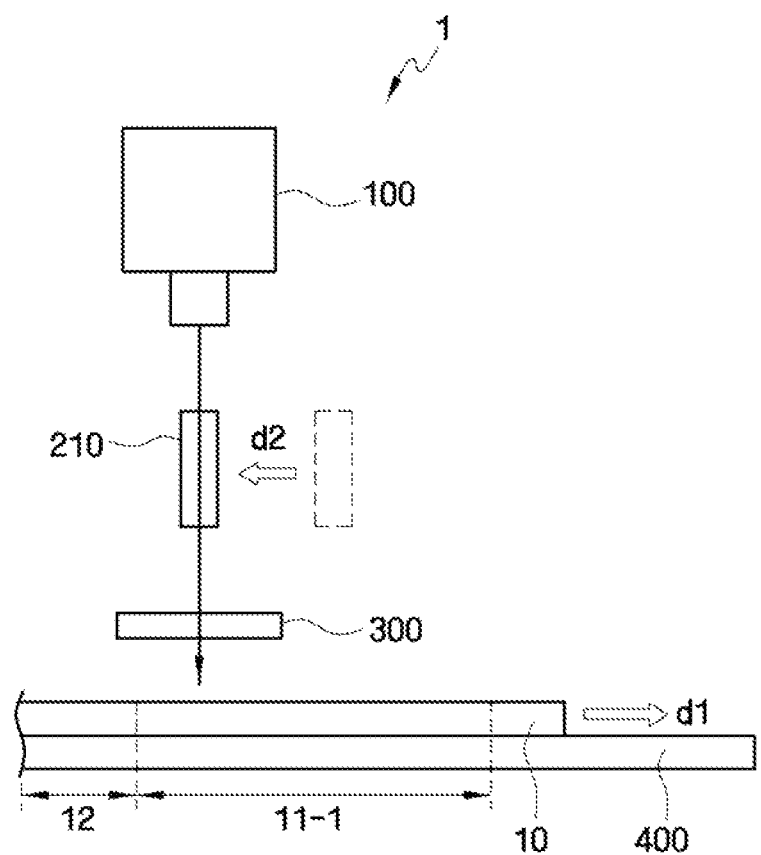

Referring to FIGS. 9A and 9B, during exposure of the first exposure area 11-1, the prism unit 200 may move in a second direction d2. As the prism unit 200 moves in the second direction d2, it may overlap the first exposure area 11-1. When the prism unit 200 overlaps the first exposure area 11-1, some of the light that is to enter the first exposure area 11-1 may be lost. Accordingly, stain defects may be generated in the first exposure area 11-1 due to the difference in exposure.

To prevent stain defects, when the prism unit 200 is moved so as to overlap first exposure area 11-1, it may also be rotated to transmit light emitted from the light source unit 100. Accordingly, even when the prism unit 200 overlaps the first exposure area 11-1, light that is to enter the first exposure area 11-1 is not lost, and thus the first exposure area 11-1 can be exposed to a constant amount of light. In addition, stain defects caused by the difference in exposure are not generated.

Figure 10A:
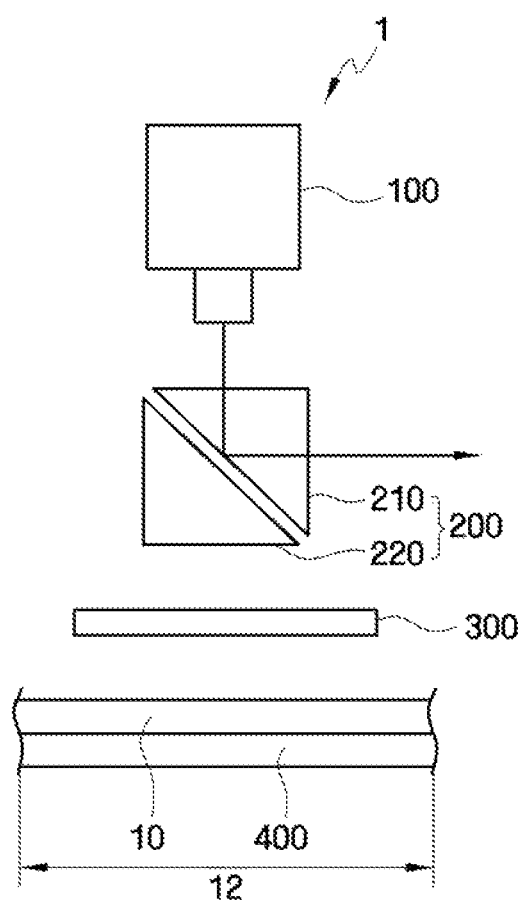
Figure 10B:
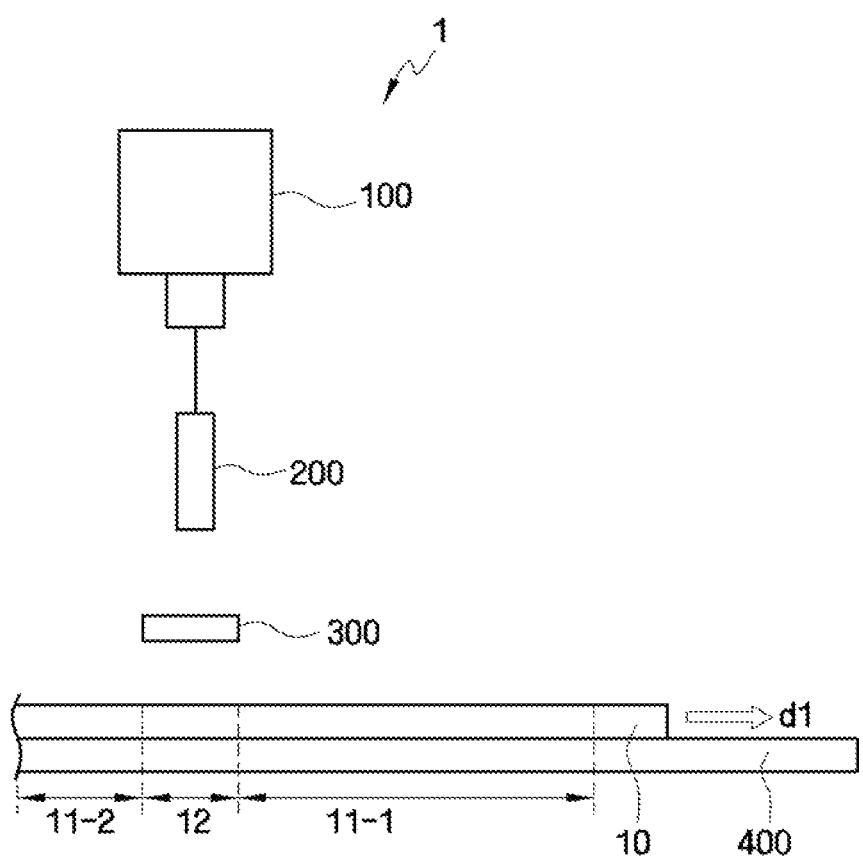

Referring to FIGS. 10A and 10B, after the prism unit 200 moves across the first exposure area 11-1 in the second direction d2, it overlaps the non-exposure area 12. Here, the substrate 10 continues to move in the first direction d1. When prism unit 200 overlaps the non-exposure area 12, it is rotated so as to substantially reflect light emitted from the light source unit 100, thus preventing the light from reaching the non-exposure area 12. As above, the prism unit 200 is rotated so as to switch from a state in which it transmits the light as shown in FIG. 9A to a state in which it substantially reflects the light. Since this has been described above in detail, a redundant description thereof will be omitted. Due to the rotation of the prism unit 200, the light emitted from the light source unit 100 does not reach the non-exposure area 12.

Figure 11A:
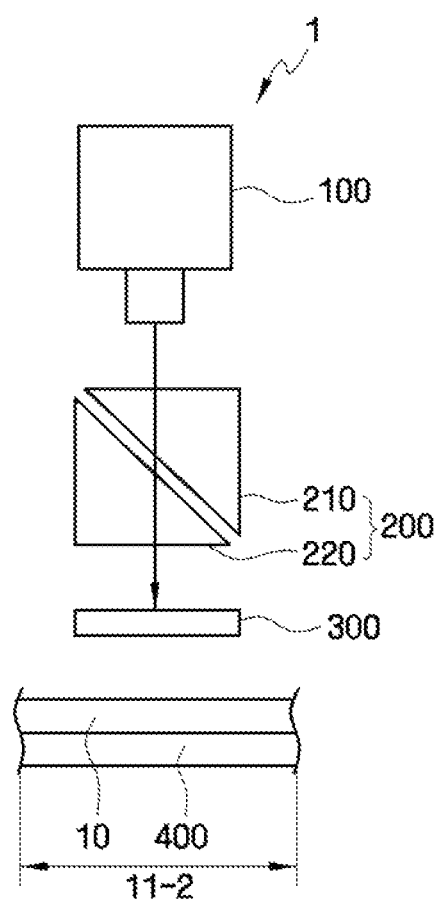
Figure 11B:
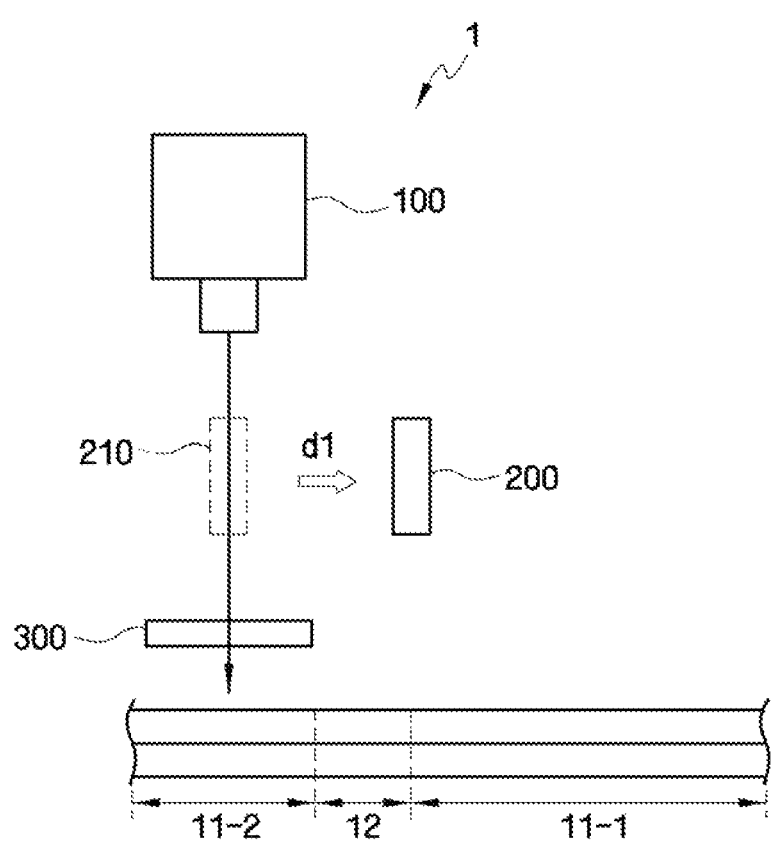

Referring to FIGS. 11A and 11B, the prism unit 200 may move in the first direction d1 at the same time that the substrate 10 moves in the first direction d1. As the substrate 10 moves in the first direction d1, the light source unit 100 and the mask unit 300, which are stationary, overlap the second exposure area 11-2. Accordingly, light emitted from the light source unit 100 reaches the second exposure area 11-2. The prism unit 200 is moved to a position that does not overlap the second exposure area 11-2. The exposure apparatus 1 performs the exposure process on the substrate 10 by repeating the above process.

In summary, during an exposure process, the prism unit 200 moves in the first direction d1 and then moves in the second direction d2, which is opposite the first direction d1, before the light source unit 100 overlaps the non-exposure area 12 of the substrate 10. When the prism unit 200 being moved in the second direction d2 overlaps the first exposure area 11-1, it is rotated to transmit light such that the light can enter the first exposure area 11-1 without loss. When the prism unit 200 being moved in the second direction d2 overlaps the non-exposure area 12, it is rotated to totally reflect light such that the light does not enter the non-exposure area 12. Then, the prism unit 200 moves again in the first direction d1 to allow light emitted from the light source unit 100 to reach the second exposure area 11-2. During the exposure of the second exposure area 11-2, the prism unit 200 moves again in the second direction d2 to block light from reaching another non-exposure area 12. Here, the prism unit 200 transmits light therethrough while being moved in the second direction d2 across the second exposure area 11-2. That is, the exposure apparatus 1 of FIG. 1 performs the exposure process as the prism unit 200 transmits or totally reflects light while being moved in the first or second direction d1 or d2. Accordingly, the exposure process can be performed without generating stain defects.

In other words, the prism unit 200 is first moved out from under the light source unit 100 (along direction d1), so that the light source unit 100 directly illuminates the first exposure area 11-1. As the substrate 10 gradually moves in direction d1, light from the light source unit 100 effectively moves in the opposite direction, toward non-exposure area 12. As it does, prism unit 200 is moved back under the light source unit 100. While the light illuminates the first exposure area 11-1, the prism unit 200 is rotated so as to transmit light. Once the light moves onto the non-exposure area 12, the prism unit 200 is rotated so as to block light from the light source unit 100, preventing light from irradiating the non-exposure area 12 and thus preventing stain defects. When the light passes over area 12 and onto the second exposure area 11-2, the prism unit 200 is again moved out from under the light source unit 100, so that the light source unit 100 directly illuminates the second exposure area 11-2. This process then repeats for further exposure and non-exposure areas, preventing stain defects across the substrate 10.

While the present invention has been particularly shown and described with reference to exemplary embodiments thereof, it will be understood by those of ordinary skill in the art that various changes in form and detail may be made therein without departing from the spirit and scope of the present invention as defined by the following claims. The exemplary embodiments should be considered in a descriptive sense only and not for purposes of limitation.

What is claimed is:

1. An exposure apparatus comprising:
a light source unit configured to emit light;
a substrate stage configured to support a substrate that has an exposure area and a non-exposure area; and
a prism unit disposed between the light source unit and the substrate stage, the prism unit movable so as to transmit the light to the exposure area and to block the light from the non-exposure area;
wherein the prism unit comprises a first prism and a second prism positioned with a gap therebetween, the first and second prisms having substantially a same shape,
wherein the first prism has a first surface and a second surface, the first prism movable so that the light is incident upon the first surface and the second surface selectively reflects or transmits the light,
wherein when the prism unit overlaps the exposure area, the first prism is movable so as to transmit the light through the second surface,
wherein a first angle $\theta 1$ between the light incident on the first surface and a normal of the second surface is smaller than $\sin^{-1}(n_o/n_1)$, where n is a refractive index of the first prism, and $n_o$ is a refractive index of a space outside the first prism,
wherein when the prism unit overlaps the non-exposure area, the first prism is movable so as to substantially reflect the light, and
wherein a second angle $\theta 2$ between the light incident on the first surface and the normal of the second surface is greater than or equal to $\sin^{-1}(n_o/n_1)$.

2. The exposure apparatus of claim 1, wherein the second prism is separated from the first prism, and has a third surface parallel to the second surface.

3. The exposure apparatus of claim 2, wherein a refractive index of the second prism is substantially the same as the refractive index of the first prism.

4. The exposure apparatus of claim 1, wherein when the first prism comprises quartz and when the refractive index no of the space outside the first prism is substantially 1.0, the second angle $\theta 2$ is greater than or equal to 40.716°.

5. The exposure apparatus of claim 1, wherein the substrate stage is configured to move the substrate in a first direction.

6. The exposure apparatus of claim 5, wherein the prism unit is movable in the first direction.

7. The exposure apparatus of claim 6, wherein when the light is irradiated onto the exposure area, the prism unit moves in a second direction while transmitting the light.

8. The exposure apparatus of claim 7, wherein when overlapping the non-exposure area, the prism unit substantially reflects the light.

9. An exposure method comprising:
providing a substrate comprising an exposure area and a non-exposure area;
irradiating light onto the substrate;
inputting the light to a prism unit;
while overlapping the prism unit and the exposure area, moving the prism unit so as to transmit the light through the prism unit and onto the exposure area of the substrate; and
while overlapping the prism unit and the exposure area, moving the prism unit so as to block the light from the non-exposure area by substantially reflecting the light;
wherein the prism unit comprises a first prism and a second prism positioned with a gap therebetween, the first and second prisms having substantially a same shape,
wherein the first prism has a first surface and a second surface, the first prism movable so that the light is incident upon the first surface and the second surface selectively reflects or transmits the light,
wherein when the prism unit overlaps the exposure area, the first prism is movable so as to transmit the light through the second surface,
wherein a first angle $\theta 1$ between the light incident on the first surface and a normal of the second surface is smaller than $\sin^{-1} (n_o/n_1)$, where $n_1$ is a refractive index of the first prism, and no is a refractive index of a space outside the first prism,
wherein when the prism unit overlaps the non-exposure area, the first prism is movable so as to substantially reflect the light, and
wherein a second angle $\theta 2$ between the light incident on the first surface and the normal of the second surface is greater than or equal to $\sin^{-1}(n_o/n_1)$.

10. The exposure method of claim 9, wherein the second prism is separated from the first prism, and has a third surface parallel to the second surface.

11. The exposure method of claim 9, wherein the moving the prism unit so as to block the light further comprises driving the first prism such that a second angle θ2 between the light incident on the first surface and the normal of the second surface is greater than or equal to $\sin^{-1}(n_o/n_1)$, where $n_1$ is the refractive index of the first prism, and no is the refractive index of the space outside the first prism.

12. The exposure method of claim 9, wherein when the first prism comprises quartz and when the refractive index no of the space outside the first prism is substantially one, the second angle θ2 is greater than or equal to 40.716 °.

13. The exposure method of claim 9, further comprising moving the substrate in a first direction.

14. The exposure method of claim 13, further comprising moving the prism unit in the first direction.

15. The exposure method of claim 14, wherein the moving the prism unit so as to transmit the light further comprises moving the prism unit in a second direction while transmitting the light.

16. The exposure method of claim 15, wherein the moving the prism unit so as to block the light further comprises substantially reflecting the light with the prism unit.

\* \* \* \* \*